United States Patent
Loewenhardt et al.

[11] Patent Number: 5,900,062
[45] Date of Patent: May 4, 1999

[54] LIFT PIN FOR DECHUCKING SUBSTRATES

[75] Inventors: Peter K. Loewenhardt, Santa Clara; Hiroji Hanawa, Sunnyvale; Raymond Gristi, San Jose; Gerald Zheyao Yin, Sunnyvale; Yan Ye, Campbell, all of Calif.

[73] Assignee: Applied Materials, Inc., Santa Clara, Calif.

[21] Appl. No.: 08/579,230

[22] Filed: Dec. 28, 1995

[51] Int. Cl.$^6$ ............................. C23C 16/00; H02N 13/00
[52] U.S. Cl. ............ 118/723 R; 118/715; 118/719; 361/143; 361/144; 361/145; 361/225; 361/230; 361/233; 361/234; 361/235; 156/345; 156/643.1; 307/127; 307/130
[58] Field of Search .................. 118/723 R, 715, 118/719; 361/143, 144, 145, 225, 230, 233, 234, 235; 156/345, 643.1; 250/491.1, 492.2; 307/127, 130

[56] References Cited

U.S. PATENT DOCUMENTS

| | | | |
|---|---|---|---|
| 4,891,087 | 1/1990 | Davis et al. | 156/345 |
| 5,350,479 | 9/1994 | Collins et al. | 156/345 |
| 5,366,002 | 11/1994 | Tepman | 165/1 |
| 5,459,632 | 10/1995 | Birang et al. | 361/234 |
| 5,552,955 | 9/1996 | Mashiro et al. | 361/234 |
| 5,612,850 | 3/1997 | Birang et al. | 361/234 |
| 5,684,669 | 11/1997 | Collins et al. | 361/234 |

FOREIGN PATENT DOCUMENTS

| | | |
|---|---|---|
| 4253356 | 9/1992 | Japan . |
| 5275517 | 10/1993 | Japan . |

OTHER PUBLICATIONS

European Search Report Communication dated Jun. 2, 1998.

*Primary Examiner*—Cecilia J. Tsang
*Assistant Examiner*—Abdel A. Mohamed
*Attorney, Agent, or Firm*—Ashok Janah

[57] ABSTRACT

A lift pin 95 for dechucking a substrate 15 held to a chuck 50 by residual electrostatic charge, the substrate being processed in a plasma formed using RF currents, is described. The lift pin 95 comprises (a) a movable elongated member 110 having a tip 115 suitable for lifting and lowering the substrate 15 off the chuck 50, and capable of forming an electrically conductive path between the substrate 15 and a current sink 105. The electrically conductive path comprises at least one of the following: (1) a frequency selective filter capable of filtering RF currents flowing therethrough so that substantially no RF currents flow through the filter; or (2) a resistor having a resistance sufficiently elevated to reduce the voltage caused by RF currents flowing therethrough, by at least about 50%. The lift pin 95 allows the residual electrostatic charge in the substrate 15 to be discharged to the current sink 105 substantially without allowing RF currents, used to form a plasma in the process chamber and to attract the plasma to the substrate, from flowing to the current sink 105.

39 Claims, 2 Drawing Sheets

LIFT PIN FOR DECHUCKING SUBSTRATES

BACKGROUND

The present invention relates to lift pins used for dechucking substrates held by electrostatic chucks in process chambers.

In semiconductor processing, lift pins are used to lift and lower a semiconductor substrate onto a chuck that is used to hold the substrate in a process chamber. Typically, a robotic arm transports the substrate into an upper portion of the process chamber where the substrate is deposited on lift pins that extend upwardly through the chuck. The lift pins are then lowered into a lower portion of the process chamber to deposit the substrate on the chuck. Thereafter, the robotic arm is withdrawn from the chamber.

Electrostatic chucks are often used to electrostatically attract and hold the substrate in the process chamber during processing of the substrate. Electrostatic chucks are either monopolar or bipolar chucks. A monopolar electrostatic chuck has a single electrode which operates in conjunction with a plasma formed in the process chamber to accumulate opposing electrostatic charge in the substrate and the electrode. A bipolar chuck can be used in non-plasma processes, and typically includes two or more electrodes which are maintained at opposing electric potentials to induce opposing electrostatic charge in the electrodes and substrate. The opposing electrostatic charges in the substrate and the electrodes of the chuck cause the substrate to be electrostatically held to the chuck. Typically, the electrodes of the chuck are electrically biased with respect to the substrate by a DC voltage or a low frequency AC voltage. Also, typically, the plasma in the process chamber is formed by (i) inductive coupling by applying a high frequency RF current to an inductor coil wound around the chamber, (ii) capacitive coupling using process electrodes in the chamber, or (iii) both inductive and capacitive coupling.

After processing of the substrate, the DC voltage applied to the chuck electrode is terminated to release the substrate, and the lift pins are raised upward through holes in the chuck to lift the substrate off the chuck by pushing up against the substrate. The robotic arm is then reinserted below the substrate to withdraw the processed substrate from the chamber.

One problem with conventional lift pins arises when the lift pins attempt to lift the substrate off the chuck. Residual electrostatic charge in the substrate generates attractive electrostatic forces between the substrate and the chuck, that cause the substrate to adhere to the chuck, even when the voltage to the chuck is terminated. The upwardly pushing lift pins can damage or break the substrate. This problem is worse when the lift pins are made of ceramic material. The electrically insulative ceramic pins trap residual electrostatic charge in the substrate, causing the substrate to stick to the chuck as the lift pins are pushed against the substrate, resulting in damage or breakage of the substrate.

One solution is to use electrically grounded metal lift pins that allow the residual charge in the substrate to discharge through the lift pins. However, the metal pins also allow the high frequency RF currents used to generate the plasma in the chamber, and to attract the plasma to the substrate, to propagate through the metal pins and into the lower portion of the chamber. This results in plasma formation in the lower portion of the chamber, causing erosion of the metal parts therein, and wasting the power used to generate the plasma. Also, the plasma heats up the lower portion of the process chamber, and causes deposits to form on the components therein.

Therefore, there is a need for lift pins which allow discharging of residual electrostatic charge in a substrate to prevent damage or breakage of the substrate during dechucking of the substrate. It is further desirable for the lift pins to reduce propagation of the RF currents used to generate a plasma into the lower portion of the process chamber. The present invention satisfies these needs.

SUMMARY

The present invention provides a lift pin capable of dechucking a substrate held to a chuck by residual electrostatic charge, the substrate being processed in a plasma formed using RF currents. The lift pin comprises a movable elongated member having a tip suitable for lifting and lowering the substrate off the chuck, and capable of forming an electrically conductive path between the substrate and a current sink. In one version, the electrically conductive path of the movable elongated member comprises at least one of the following: (1) a frequency selective filter capable of filtering RF currents flowing therethrough so that substantially no RF currents flow through the filter; or (2) a resistor having a resistance sufficiently elevated to reduce the voltage caused by RF currents flowing therethrough, by at least about 50%. In another version, the electrically conductive path of the movable elongated member comprises at least one of the following: (1) a current limiter capable of limiting flow of the RF currents therethrough while allowing substantially all the residual electrostatic charge in the substrate to flow therethrough; or (2) a voltage reducer capable of reducing the voltage caused by RF currents flowing therethrough while allowing substantially all the residual electrostatic charge in the substrate to flow therethrough. The lift pin allows the residual electrostatic charge in the substrate to be discharged to the current sink substantially without allowing RF currents, used to form a plasma in the chamber and to attract the plasma to the substrate, from flowing to the current sink.

In another aspect, the present invention comprises a lift pin assembly comprising a plurality of elongated members mounted on a support. At least one elongated member comprises (i) an electrically conductive upper portion suitable for contacting the substrate; (ii) an electrically conductive lower portion suitable for electrical connection to a current sink; and (iii) a central portion including the frequency selective filter or resistor described above. Lift bellows capable of lifting and lowering the support are provided so that the elongated members on the support can lift or lower the substrate.

The present invention is also directed to a plasma process chamber comprising: (a) a gas distributor for distributing process gas in the process chamber; (b) a plasma generator for forming a plasma from the process gas; and (c) an electrostatic chuck for holding a substrate using electrostatic charge. A plurality of lift pins are provided for lifting and lowering the substrate off the electrostatic chuck. At least one lift pin is capable of forming an electrically conductive path between the substrate and a current sink. The electrically conductive path comprises the frequency selective filter or resistor described above.

In another aspect, the present invention comprises a method of dechucking a substrate held to an electrostatic chuck by residual electrostatic charge, the substrate being processed in a plasma formed using RF currents. The method comprises the steps of: (a) discharging the residual electrostatic charge in the substrate to a current sink, substantially without allowing the RF currents from flowing to the current sink; and (b) lifting the substrate off the electrostatic chuck after the residual electrostatic charge in the substrate is substantially discharged.

DRAWINGS

These and other features, aspects, and advantages of the present invention will become better understood with reference to the following description, appended claims, and accompanying drawings which illustrate examples of the invention, where:

DESCRIPTION

The present invention provides an apparatus and method for dechucking a substrate held to a chuck by residual electrostatic charge. The apparatus is particularly useful for plasma processes, where RF currents are used to generate a plasma for processing the substrate. Examples of such plasma processes include plasma enhanced chemical vapor deposition, sputtering processes, ion implantation processes, and plasma etching or reactive ion etching processes.

Figure 1:
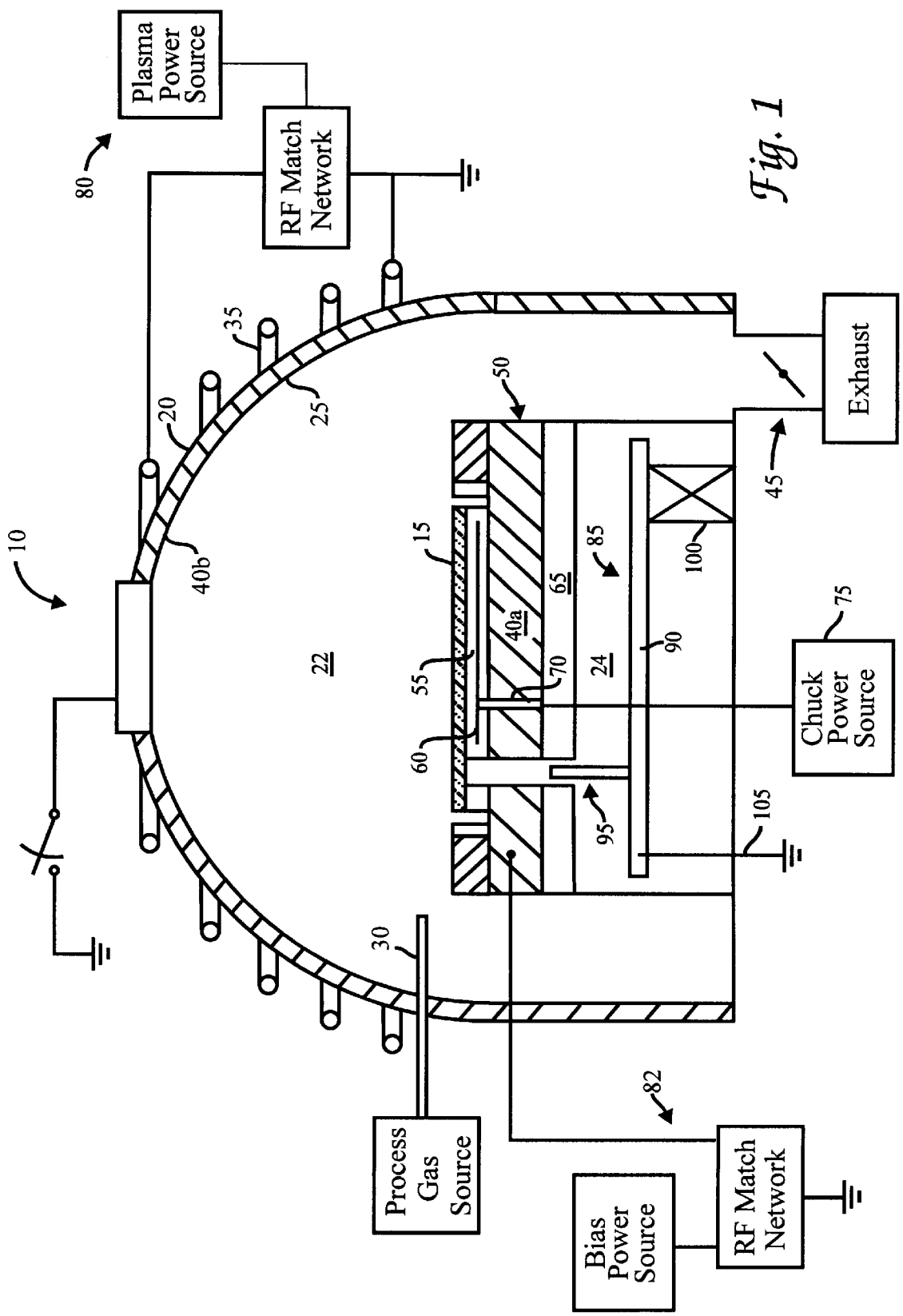
FIG. 1 is a schematic cross-sectional side view of a plasma processing apparatus according to the present invention.

An exemplary apparatus 10 suitable for plasma processing of a semiconductor substrate 15 is shown in FIG. 1. The particular embodiment of the apparatus 10 shown herein, is suitable for plasma processing of substrates 15, is provided to illustrate the present invention, and should not be used to limit the scope of the invention. For example, the invention can also be used for non-plasma processes, and can be used for manufacturing processes other than semiconductor fabrication.

The apparatus 10 generally comprises an enclosed process chamber 20 having an upper portion 22, a lower portion 24, and surrounded by walls 25. Process gas is introduced into the chamber 20 through a gas distributor 30. The process gas can be inductively coupled to form a plasma in the upper portion 22, using an inductor coil 35 wound around the chamber 20, or capacitively coupled by process electrodes 40a, 40b in the chamber 20. Combined inductive and capacitive coupling can also be used to form a more uniform or directed plasma in the chamber 20. An exhaust manifold 45 is provided for withdrawing spent process gas and process gas byproducts from the process chamber 20.

The apparatus 10 also includes an electrostatic chuck 50 used to hold a semiconductor substrate 15, such as a silicon wafer, during processing of the substrate 15. A typical electrostatic chuck 50 comprises an electrostatic member 55 including one or more insulated electrodes 60. The chuck 50 is secured to a support 65 in the process chamber 20. An electrical connector 70 electrically connects the electrodes 60 in the chuck to a conventional electrostatic chuck power source 75 suitable for powering the chuck.

In plasma processes, a substrate 15 is placed on the electrostatic member 55 that is electrically biased with respect to the substrate 15 by the chuck power source 75. Process gas is introduced into the process chamber 20 via the gas distributor 30. A plasma can be inductively formed from the process gas by applying a high frequency RF source current to the inductor coil 35 using a plasma power source 80, and/or capacitively formed by applying a high frequency RF current to the process electrodes 40a, 40b using a bias power source 82. The RF frequencies used to inductively or capacitively form the plasma and attract the plasma to the substrate 15, are typically above 1.5 MHz, and more typically from about 1.8 MHz to about 20 MHz. In plasma processes, the voltage applied to the electrode 60 of the chuck 50 causes electrostatic charge to accumulate in the electrode, and the plasma in the chamber 20 provides electrically charged species having opposing polarity which accumulate in the substrate 15. The accumulated opposing electrostatic charge results in an attractive electrostatic force between the substrate 15 and the electrode 60 in the chuck 50, causing the substrate 15 to be electrostatically held to the chuck 50. Bipolar chucks having two electrodes (not shown) operate by electrically biasing the two electrodes with respect to one another to generate an electrostatic change that holds the substrate 15 to the chuck 50.

The lower portion 24 of the process chamber 10 comprises a lift pin assembly 85 that is used to lift and lower the substrate 15 onto the electrostatic chuck 50. A suitable lift pin assembly 85 comprises a support 90, such as a C-shaped ring, with a plurality of lift pins 95 mounted around the support 90. Preferably, at least three, and more preferably four lift pins (not shown) are mounted symmetrically on the support 90 so that the substrate 15 can be lifted off the chuck 50 by a uniformly applied pressure. The support 90 is attached to lift bellows 100 that can lift and lower the support 90, thereby lifting and lowering the lift pins 95 through the holes in the chuck 50 to lift and lower the substrate 15 off the chuck 50.

Figure 2:
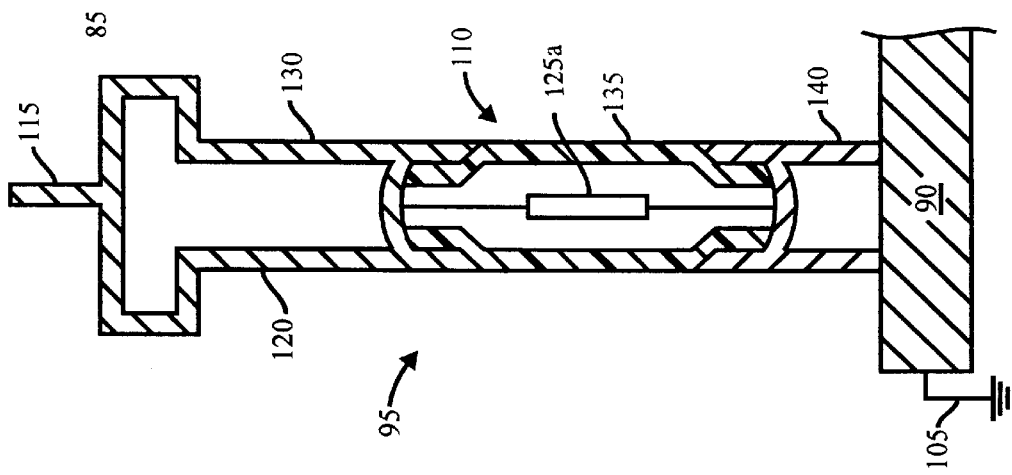
FIG. 2 is schematic cross-sectional side view of a lift pin of the present invention.

Referring to FIG. 2, lift pins 95 according to the present invention are suitable for dechucking a substrate 15 held to a chuck by residual electrostatic charge, through use of a current sink 105. Generally, the lift pins 95 comprise movable elongated members 110 having tips 115 suitable for lifting and lowering the substrate off the chuck. At least one lift pin 95 is capable of forming an electrically conductive path 120 between the substrate and the current sink 105. A voltage reducer 125a or a current limiter 125b, is coupled in series with the electrically conductive path 120 of the elongated member 110. The voltage reducer 125a operates by reducing the voltage caused by RF currents used to form a plasma and attract the plasma to the substrate 15, while the current limiter 125b operates by limiting the flow of the RF currents flowing therethrough. In this manner, the voltage reducer 125a or current limiter 125b allows substantially all the residual electrostatic charge in the substrate 15 to flow therethrough, substantially without allowing RF currents, used to form a plasma in the process chamber and to attract the plasma to the substrate, from flowing to the current sink 105.

In one version, the current limiter 125b comprises a frequency selective filter that allows substantially only currents having selected frequencies to flow from the substrate 15 to the current sink 105. The frequency selective filter conducts or "passes" currents having certain frequencies and attenuates or "blocks" currents having other frequencies. Preferably, the frequency selective filter conducts currents having lower first frequencies therethrough (that correspond to the DC or low frequency residual electrostatic charge in the substrate), substantially without conducting currents having higher second frequencies therethrough (that correspond to the frequencies of the RF currents used to generate the plasma or attract the plasma to the substrate). The residual electrostatic charge in the substrate 15 is typically a low frequency charge, such as a DC charge (having a frequency of zero when a DC current is used to operate the electrostatic chuck 50, or a low frequency AC charge when an AC current is used to operate the electrostatic chuck 50. Bipolar chucks often use low frequency (less than 100 Hz) AC currents to operate the two electrodes of the chuck. Typically, the second higher RF frequencies are at least about 0.5 MHz higher than the first lower residual charge frequencies. The first frequencies typically comprise frequencies of less than about 100 Hz, and the second frequencies typically comprise frequencies of at least about 1 MHz.

To dechuck a substrate 15 held to an electrostatic chuck 50 by low frequency electrostatic residual charge, the lift pins 95 are raised and electrically contacted against the substrate 15. When a voltage reducer 125a is used, the residual electrostatic charge in the substrate 15 discharges to the current sink 105, while the voltage caused by the high frequency RF currents used to generate or attract the plasma to the substrate, is substantially reduced, thereby resulting in substantially no plasma formation in the lower portion of the chamber. When a current limiter 125b is used, the residual electrostatic charge in the substrate 15 discharges to the current sink 105, substantially without conductance of the high frequency RF currents to the current sink 105. The substrate 15 is lifted off the chuck after the residual electrostatic charge in the substrate 15 is substantially discharged. Preferably, the lift pins 95 are continuously raised in an upward direction while the residual electrostatic charge in the substrate 15 is discharging to the current sink 105 to allow faster process throughput. Thus, the residual charge in the substrate 15 is preferably discharged to the current sink 105 in a sufficiently short time that the substrate 15 is released from the chuck 50 without breaking, while the lift pins continuously move in an upward direction.

In a preferred configuration, each of the lift pins 95 comprise an elongated member 110 comprising: (a) an electrically conductive upper portion 130 having a tip 115 suitable for lifting and lowering the substrate 15, (b) a central portion 135 comprising the voltage reducer 125a or the current limiter 125b, and (c) an electrically conductive lower portion 140 suitable for electrical connection to the current sink 105, as shown in FIG. 2. The electrically conductive upper portion 130 and lower portion 140 are made from metals or other rigid conductive materials having low resistance to current flow. The upper portion 130 can also comprise a layer of a flexible material that prevents damage to the substrate 15 when the lift pins 95 are pushed upwardly against the substrate 15.

Preferably, the central portion 135 of each lift pin 95 comprises a rigid electrically insulative shell sized to house the voltage reducer 125a or current limiter 125b. The insulative shell is mechanically connected to the upper portion 130 and the lower portion 140 so that the lift pin 95 can withstand a load when lifting the substrate 15 from the chuck 50. Preferably, the insulative shell is made from any electrically insulative polymer, such as polyimide, polyketone, polyetherketone, polysulfone, polycarbonate, polystyrene, nylon, polyvinylchloride, polypropylene, polyetherketones, polyethersulfone, polyethylene terephthalate, fluoroethylene propylene copolymers, silicone, and rubber. Preferably, the insulative shell is resistant to temperatures in excess of 50° C., and more preferably in excess of 100° C., so that the lift pin 95 can be used for high temperature processes. Typically, the insulative shell has a resistivity ranging from about $10^{13}$ Ω cm to $10^{20}$ Ω cm. The thickness of the insulative shell is typically from about 1 mm to about 5 mm.

Figure 3:
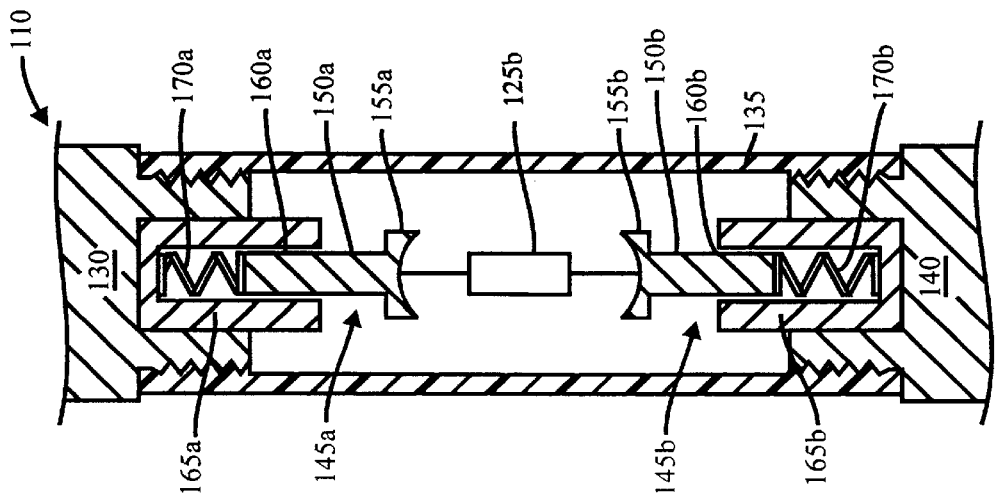
FIG. 3 is a detailed view of the lift pin of FIG. 2.

A preferred configuration for a lift pin 95 is shown in FIG. 3. In this configuration, the lift pin 95 includes metal upper and lower portions 130, 140 with a central portion 135 comprising a polymeric insulative shell disposed therebetween. The central portion 135 of the lift pin 95 houses the voltage reducer 125a or current limiter 125b. Holder assemblies 145a, 145b are used to maintain the electrical leads of the voltage reducer 125a or current limiter 125b in electrical contact with the upper and lower portions 130, 140 of the lift pin 95. The holder assemblies 145a, 145b comprise of opposing holder pins 150a, 150b having (i) concave heads 155a, 155b sized to receive the leads of the resistor, and (ii) tails 160a, 160b that fit into tubular jackets 165a, 165b. Springs 170a, 170b positioned at the tails of the holder pins fit inside the tubular jackets 165a, 165b. When the insulative shell 135 is threadingly attached to the upper and lower portions 130, 140 as shown, the springs 170a, 170b and the holder pins 150a, 150b maintain a secure electrical contact with the voltage reducer 125a or current limiter 125b. The lower portion 140 of the lift pin 95 is electrically connected to ground as a current sink 105. This configuration is advantageous because the voltage reducer 125a or current limiter 125b, can be easily replaced simply by unscrewing the upper or lower portions 130, 140 of the lift pin 95 to change the voltage reducer 125a or current limiter 125b. Replacement is necessary when the voltage reducer 125a or current limiter 125b short-out under high current loads, or corrode in the corrosive plasma processing environments.

The frequency selective filter version of the current limiter 125b will now be described. Typically, the frequency selective filter comprises a low-pass filter capable of discharging low frequency residual electrostatic charge in the substrate 15 to the current sink 105. The pass band of the low-pass filter extends from DC current to a finite cut-off high frequency, so that the low-pass filter substantially blocks flow of high frequency RF currents used to generate or direct the plasma in the process chamber. Preferably, the low-pass filter has a cut-off frequency of less than about 10 MHz, and more preferably less than about 1 MHz, to allow discharging residual electrostatic charge in the substrate 15 to the current sink 105, while blocking flow of the high frequency RF currents. Preferably, the frequency selective filter conducts at least about 90% of the currents having the first lower residual charge frequencies therethrough, and less than about 10% of the currents having the second higher RF frequencies therethrough.

The time taken for the residual electrostatic charge in the substrate 15 to discharge through the low-pass filter of the lift pin 95 is limited by the rate at which the lift pin 95 rises upwardly from the chuck 50. As such, the time for discharge is a function of (i) the speed at which the lift pins 95 move up, and (ii) the resilience and flexibility of the substrate 15. Preferably, the low-pass filter discharges the residual charge in the substrate 15 in a sufficiently short time that attractive electrostatic forces between the substrate 15 and the chuck 50 do not cause the substrate 15 to flex or break when the substrate 15 is lifted off the chuck 50 by the lift pins 95. Typically, it takes about 10 milliseconds for the lift pins 95 to lift the substrate 15 off the electrostatic chuck 50. Furthermore, in plasma processes, the residual electrostatic charge in the substrate 15 generally comprises DC charge or low frequency AC charge having frequencies of less than about 100 Hz, and having a time period of less than about 10 milliseconds. Thus, preferably, the low-pass filter discharges the residual electrostatic charge in the substrate 15 in less than about 10 milliseconds, and more preferably in less than 100 milliseconds.

The frequency selective filter typically comprises an inductive circuit, including an inductor coupled in series with the electrically conductive path 120 of the lift pin 95.

The inductance of the inductor is selected to resist flow of the high frequency RF currents therethrough. The impedance of an inductor to a RF signal is defined by the equation:

$$X_L = 2\pi f L \qquad \langle 1 \rangle$$

where $X_L$ is the inductive reactance in $\Omega$, f is the frequency of the RF current in Hz, and L is the inductance of the inductor in H.

The combination of the substrate 15, the electrode within the electrostatic chuck 50, and the inductor forms an inductor-capacitor circuit. When an inductor and a capacitor are connected in series or in parallel, they form a resonant circuit having a resonant frequency F<res>defined by equation:

$$F\langle res \rangle = \frac{X_L}{2\pi L} \qquad \langle 2 \rangle$$

where L is impedance in H and $X_L$ is impedance in $\Omega$.

In order to allow the low frequency residual electrostatic charge in the substrate 15 to flow through the frequency selective filter while blocking the high frequency RF currents, the resonant frequency of the inductor circuit should be higher than the frequencies of the RF currents. Depending on the frequencies of the RF currents, suitable values for the inductance of the inductor are selected so that the resonant frequency of the inductor circuit is greater than the frequencies of the RF currents. Preferably, inductance values for the inductor are from about 10 $\mu$H to about 1,000 $\mu$H, and more preferably from about 100 $\mu$H to about 500 $\mu$H.

In another embodiment of the invention, the voltage reducer 125a comprises a resistor coupled in series with the electrically conductive path 120 defined by the lift pin 95. The resistor has a resistance sufficiently elevated to reduce the voltage caused by the RF currents flowing therethrough by at least about 50%, and more preferably at least about 75%. The resistor has a resistance sufficiently elevated that the resistor is capable of discharging residual electrostatic charge in the substrate while causing a drop in voltage of the RF currents used to generate the plasma or attract the plasma to the substrate, to a voltage level sufficiently low that the high frequency RF currents do not form a plasma in lower portions of the chamber.

The resistance of the resistor affects the length of time taken for discharge of the residual electrostatic charge in the substrate 15. This occurs because the resistor, substrate 15, and the chuck 50, form an RC circuit having a time constant R*C seconds, where C is capacitance in farads, and R is resistance in $\Omega$. The time constant is the number of seconds required for the capacitor to reach about 63% of its full charge after a voltage is applied. Thus, depending on the capacitance of the substrate 15 and chuck 50, the value of the resistor is selected to obtain the desirable time constant as limited by the speed with which the lift pin 95 lifts the substrate 15 off the chuck 50. Typically, the electrostatically charged substrate 15 and chuck 50 form a capacitor having a capacitance of about 1,000 pF. To determine a suitable resistance value for the resistor, the RC time constant equation is solved to determine the resistance value equal to the ratio of a desired time constant to the capacitance. Preferably, the resistance of the resistor is at least about 10 M$\Omega$, and more preferably from about 10 to 100 M$\Omega$, to achieve a 10 millisecond discharge period.

Selection of the type of resistor depends on the operating frequencies of the RF currents and the residual electrostatic charge in the substrate 15. Resistors change in their resistance value when subjected to RF alternating currents. The change in resistance with increasing frequency occurs because resistors have some inductance and capacitance in addition to the resistive component. The effect of frequency on resistance varies with the resistor construction. Wire-wound resistors typically exhibit an increase in their impedance with frequency. In composition resistors, capacitances are formed by the many conducting particles which are held in contact by a dielectric binder. Film resistors have the most stable RF performance, with their AC impedance remaining constant until about 100 Hz and decreasing at higher frequencies, and their decrease in DC resistance at higher frequencies decreasing for increasing resistances. Also, the smaller the diameter of the resistor, the better is its frequency response. Most RF resistor have a length to diameter ratio of 1:4 to 10:1. Thus, dielectric losses are kept to a minimum by proper choice of resistor material.

In an alternative configuration, the resistor comprises a semiconductor having a resistance that is sufficiently elevated to reduce the amplitude of the RF currents flowing therethrough by at least about 50%, and more preferably at least about 75%. In this version, at least a portion of, or the entire lift pin 95 comprises a semiconductor material that operates as a resistor. The semiconductor material has an elevated resistance so that the lift pin 95 can discharge residual electrostatic charge in the substrate 15 while reducing the amplitude of RF currents flowing therethrough to a level sufficiently low that the RF currents do not form a plasma in the lower portions of the chamber 20. The path length and resistance of the semiconductor is selected to operate as a resistor, as described above. Suitable semiconductor materials include titanium oxide, silicon carbide, silicon, and any other material that can be doped to form a semiconductor material, as is conventionally known to those skilled in the art. Conventional ceramic casting, molding, and pressure-forming processes can be used to fabricate a semiconductor structure shaped like the lift pin 95. For example, a semiconductor lift pin 95 can be fabricated by forming a slurry of titanium oxide and pouring the slurry into a mold corresponding to the desired shape of the lift pin 95. After drying the component, the titanium oxide lift pin 95 is fired to a temperature sufficiently elevated to sinter the titanium oxide to form a hard semiconductive titanium oxide lift pin 95. Conventional machining techniques can be used to shape, smooth, or machine holes in the lift pin 95 so that the lift pin can be attached to the support 90. Mixtures of ceramic insulative powders and conductive metal powders can also be used to provide the desired resistance for the semiconductor material.

The voltage reducer 125a or the current limiter 125b can also comprise a resistive-inductive circuit that includes a combination of an inductor and a resistor, coupled in series with the electrically conductive path 120. The inductance of the inductor, and the resistance of the resistor, are selected to provide a combination resistive-inductive circuit having the desired characteristics as described above. Preferably, the resistance of the resistor is at least about 10 M$\Omega$, and more preferably from about 10 to 100 M$\Omega$, and the inductance values for the inductor is from about 10 $\mu$H to about 1,000 $\mu$H, and more preferably from about 100 $\mu$H to about 500 $\mu$H, to achieve a 10 millisecond discharge period.

Although the present invention has been described in considerable detail with reference to certain preferred versions, other equivalent versions should be apparent to those skilled in the art. Therefore, the spirit and scope of the appended claims should not be limited to the description of the preferred versions contained herein.

What is claimed is:

1. A lift pin for dechucking a substrate held to a chuck by residual electrostatic charge, the substrate being processed in a plasma formed using radio frequency currents, the lift pin comprising:

(a) a movable elongated member having a tip suitable for lifting and lowering the substrate off the chuck, the movable elongated member providing an electrically conductive path between the substrate and a current sink when the tip contacts the substrate to allow the residual electrostatic charge to flow therethrough; and (b) the electrically conductive path of the movable elongated member comprising:

(1) a frequency selective filter that reduces the amperage of radio frequency currents flowing therethrough; or (2) a resistor having a resistance sufficiently elevated to reduce a voltage of radio frequency currents flowing therethrough, by at least 50%.

2. The lift pin of claim 1, wherein the elongated member comprises:

(a) an electrically conductive upper portion suitable for lifting and lowering the substrate;

(b) a central portion comprising the frequency selective filter or resistor; and (c) an electrically conductive lower portion suitable for electrical connection to the current sink.

3. The lift pin of claim 1, wherein the frequency selective filter conducts currents having first frequencies therethrough substantially without conducting currents having second frequencies therethrough, the second frequencies being at least 0.5 MHz higher than the first frequencies.

4. The lift pin of claim 1, wherein the frequency selective filter conducts currents having first frequencies of less than 100 Hz substantially without conducting currents having second frequencies of at least 1 MHz.

5. The lift pin of claim 3, wherein the frequency selective filter conducts at least 90% of the currents having the first frequencies therethrough and less than 10% of the currents having the second frequencies therethrough.

6. The lift pin of claim 1, wherein the frequency selective filter includes a low-pass filter having a cut-off frequency of less than 10 MHz.

7. The lift pin of claim 6, wherein the low-pass filter comprises an inductive circuit that includes a resistor having a resistance of at least 10 MΩ.

8. The lift pin of claim 6, wherein the cut-off frequency of the lowpass filter is less than 1 MHz.

9. The lift pin of claim 6, wherein the low-pass filter includes an inductive circuit having an impedance sufficiently high to discharge the residual electrostatic charge in the substrate to the current sink in less than 10 msec.

10. The lift pin of claim 8, wherein the inductive circuit comprises an inductor having an inductance of from about 10 μH to about 1000 μH.

11. The lift pin of claim 1, wherein the resistor has a resistance sufficiently high to discharge residual electrostatic charge in the substrate to the current sink in less than 10 msec.

12. The lift pin of claim 11, wherein the resistor has a resistance of at least 10 MΩ.

13. The lift pin of claim 12, wherein the resistor has a resistance of from about 10 to about 100 MΩ.

14. A lift pin for dechucking a substrate held to a chuck by residual electrostatic charge, the lift pin comprising;

(a) a movable elongated member having a tip suitable for lifting and lowering the substrate off the chuck, the movable elongated member providing an electrically conductive path between the substrate and a current sink when the tip contacts the substrate to allow the residual electrostatic charge to flow therethrough; and (b) the electrically conductive path comprising:

(1) a current limiter that reduces the amperage of a radio frequency current passing therethrough while allowing the residual electrostatic charge in the substrate to flow therethrough; or (2) a voltage reducer that reduces a voltage of a radio frequency current passing therethrough while allowing the residual electrostatic charge in the substrate to flow therethrough.

15. The lift pin of claim 14, wherein the current limiter comprises a frequency selective filter that conducts currents having first frequencies therethrough substantially without conducting currents having second frequencies therethrough, the second frequencies being at least 1 MHz higher than the first frequencies.

16. The lift pin of claim 15, wherein the frequency selective filter conducts at least 90% of the currents having the first frequencies therethrough and less than 10% of the currents having the second frequencies therethrough.

17. The lift pin of claim 14, wherein the current limiter includes an inductive circuit having an impedance sufficiently high to discharge the residual electrostatic charge in the substrate to the current sink in less than 10 msec.

18. The lift pin of claim 17, wherein the inductive circuit comprises an inductor having an inductance of from about 10 μH to about 1000 μH.

19. The lift pin of claim 14, wherein the voltage reducer comprises a resistor having a resistance sufficiently high to discharge residual electrostatic charge in the substrate to the current sink in less than 10 msec.

20. The lift pin of claim 19, wherein the resistor has a resistance of at least 10 MΩ.

21. The lift pin of claim 20, wherein the resistor has a resistance of from about 10 to about 100 MΩ.

22. A lift pin assembly for dechucking a substrate held to a chuck by residual electrostatic charge, the substrate processed in a plasma formed using radio frequency currents, the lift pin assembly comprising:

(a) a support;

(b) a plurality of elongated members mounted on the support, at least one elongated member comprising:

(i) an electrically conductive upper portion suitable for contacting the substrate;

(ii) an electrically conductive lower portion suitable for electrical connection to a current sink to allow the flow of the residual electrostatic charge from the substrate to the current sink; and (iii) a central portion comprising (1) a frequency selective filter that reduces the amperage of radio frequency currents flowing therethrough, or (2) a resistor having a resistance sufficiently elevated to reduce a voltage of radio frequency currents flowing therethrough by at least 50%; and (c) lift bellows that lift and lower the support so that the elongated members on the support can lift or lower the substrate.

23. The lift pin assembly of claim 22, wherein the frequency selective filter comprises a low-pass filter having a cut-off frequency of less than 10 MHz to allow substantially only currents having frequencies less than 10 MHz to flow from the substrate to the current sink.

24. The lift pin assembly of claim 23, wherein the low-pass filter includes an inductive circuit having an impedance sufficiently high to discharge the residual electrostatic charge in the substrate to the current sink in less than 10 msec.

25. The lift pin assembly of claim 24, wherein the low-pass filter includes an inductor having an inductance of from about 10 μH to about 1000 μH.

26. The lift pin assembly of claim 22, wherein the resistor has a resistance sufficiently high to discharge residual electrostatic charge in the substrate to the current sink in less than 10 msec.

27. The lift pin assembly of claim 26, wherein the resistor has a resistance of at least 10 MΩ.

28. A plasma process chamber comprising:
 (a) a gas distributor for distributing process gas in the process chamber;
 (b) a plasma generator for forming a plasma from the process gas using radio frequency currents;
 (c) an electrostatic chuck for holding a substrate in the plasma; and
 (d) a plurality of lift pins for lifting and lowering the substrate off the electrostatic chuck, at least one lift pin providing an electrically conductive path between the substrate and a current sink to allow the flow of residual electrostatic charge from the substrate to the current sink when the lift pin contacts the substrate, the electrically conductive path comprising a frequency selective filter that reduces the amperage of radio frequency currents flowing therethrough, or a resistor having a resistance sufficiently elevated to reduce a voltage of radio frequency currents flowing therethrough by at least 50%.

29. The plasma process chamber of claim 28, wherein the radio frequency currents have frequencies of at least 1 MHz, and the residual electrostatic charges in the substrate have frequencies of less than 100 Hz.

30. The plasma process chamber of claim 28, wherein the frequency selective filter comprises a low-pass filter having a cut-off frequency of less than 10 MHz to allow substantially only currents having frequencies less than 10 MHz to flow from the substrate to the current sink.

31. The plasma process chamber of claim 30, wherein the frequency selective filter includes an inductive circuit having an impedance sufficiently high to discharge the residual electrostatic charge in the substrate to the current sink in less than 10 msec.

32. The plasma process chamber of claim 31, wherein the frequency selective filter includes an inductor having an inductance of about 10 μH to about 1000 μH.

33. The plasma process chamber of claim 28, wherein the resistor has a resistance sufficiently high to discharge residual electrostatic charge in the substrate to the current sink in less than 10 msec.

34. The plasma process chamber of claim 33, wherein the resistor has a resistance of at least 10 MΩ.

35. A method of dechucking a substrate held to an electrostatic chuck by residual electrostatic charge, the substrate processed in a plasma formed using radio frequency currents, the method comprising the steps of:
 (a) discharging the residual electrostatic charge in the substrate to a current sink while reducing the voltage or amperage of the radio frequency currents flowing to the current sink by providing audio frequency voltage reduce or a radio frequency current limiter in an electrical pathway between the substrate and the current sink; and
 (b) lifting the substrate off the electrostatic chuck after the residual electrostatic charge in the substrate is substantially discharged.

36. The dechucking method of claim 35, wherein the step of discharging the residual electrostatic charge in the substrate to the current sink comprises electrically connecting the substrate to the current sink by a current limiter that conducts radio frequency currents having first frequencies while reducing the amperage of radio frequency currents having second frequencies passing therethrough to allow the residual electrostatic charge in the substrate to flow therethrough, the second frequencies being at least 1 MHz higher than the first frequencies.

37. The dechucking method of claim 35, wherein the step of discharging the residual electrostatic charge in the substrate to the current sink comprises electrically connecting the substrate to a current sink using a voltage reducer that reduces a voltage of radio frequency currents flowing therethrough by at least 50% while allowing the residual electrostatic charge in the substrate to flow therethrough.

38. The dechucking method of claim 35, wherein step (b) is performed simultaneously with step (a), and wherein the residual electrostatic charge in the substrate is discharged to the current sink in a sufficiently short time that the substrate is dechucked without breaking.

39. The dechucking method of claim 38, wherein the step of discharging the residual electrostatic charge in the substrate to the current sink is performed in less than about 10 msec.

\* \* \* \* \*